Sept. 3, 1968 S. R. ORFEO ET AL 3,400,077
FLUORINATED HYDROCARBON CONTAINING COMPOSITIONS
Filed June 1, 1967
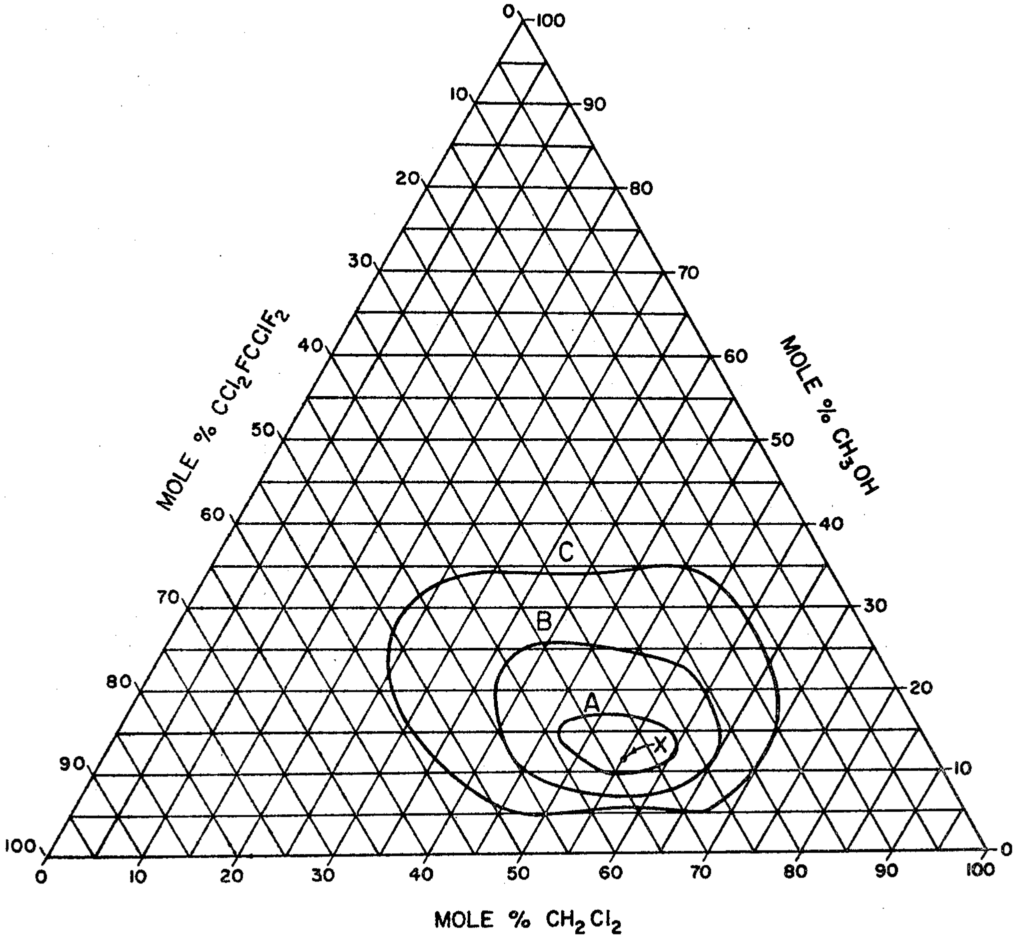
*INVENTORS.*
SABATINO R. ORFEO
KEVIN P. MURPHY
CARY A. BEGUN
Jay P. Friedenson
*ATTORNEY*

United States Patent Office 3,400,077
Patented Sept. 3, 1968

3,400,077
FLUORINATED HYDROCARBON CONTAINING COMPOSITIONS

Sabatino R. Orfeo, Morris Plains, and Kevin P. Murphy, Bernardsville, N.J., and Cary A. Begun, Mentor, Ohio, assignors to Allied Chemical Corporation, New York, N.Y., a corporation of New York Continuation-in-part of application Ser. No. 515,737, Dec. 22, 1965. This application June 1, 1967, Ser. No. 642,843
4 Claims. (Cl. 252—171)

ABSTRACT OF THE DISCLOSURE

Certain ternary mixtures of 1,1,2-trichlorotrifluoroethane, methylene chloride and methanol are useful as solvents to remove rosin fluxes from printed circuit boards containing the same. These mixtures are useful not only because of their high solvency characteristics but also because they exhibit essentially the constant boiling characteristics of a ternary azeotrope which is formed between these components, thereby facilitating handling and purification of the solvent mixtures without significantly altering their compositions. The ternary mixtures disclosed herein exhibit substantially higher solvency characteristics for rosin fluxes than the known binary azeotropic systems containing 1,1,2-trichlorotrifluoroethane and methylene chloride or methanol.

Cross-reference to related application

This application is a continuation-in-part of our copending application entitled, "Fluorinated Hydrocarbon Containing Compositions," Ser. No. 515,737, filed Dec. 22, 1965, now abandoned.

Background of the invention

The electronic industry has sought for solvents which can efficiently remove rosin fluxes from printed circuit boards containing the same. The rosin fluxes are intentionally deposited on the surface of the circuit boards prior to soldering on electronic components, but must be removed after soldering in order to achieve maximum reliability of the printed circuits. The solvent must not only be highly effective for removing the undesired rosin flux but must, for commercial applications, be stable, nonflammable and must be inert towards the electronic components on the circuit board itself.

A variety of solvents have been tested for such purposes but generally have been found to be lacking, to a greater or lesser extent, one or more of the above described properties. For example, whereas highly chlorinated solvents, such as $CH_2Cl_2$ and $CHCl_3$, are highly effective for the removal of rosin flux; such solvents, when used alone, attack the electronic components on the circuit board. Such solvents also require the addition of a stabilizer to prevent decomposition. A variety of non-constant boiling mixtures have been employed to achieve the desired solvency, while retaining the desired inertness towards the electrical components. Preferential evaporation of the more volatile component of such mixtures, however, can result in mixtures having less desirable properties, such as lower solvency for rosin fluxes, less inertness towards the electrical components and increased flammability.

A number of binary azeotropic (constant boiling) mixtures have been employed for the purpose of cleaning electrical circuits, which afford many of the advantages obtainable with solvent mixtures, but which do not suffer from the above described major disadvantage possessed by non-constant boiling solvent mixtures. Illustrative of such binary azeotropic systems are the azeotrope of 1,1,2-trichlorotrifluoroethane and methylene chloride, B.P. 37° C. at 760 mm. pressure (U.S.P. 2,999,817) and the binary azeotrope of 1,1,2-trichlorotrifluoroethane and methyl alcohol, B.P. 39° C. at 760 mm. pressure (U.S.P. 2,999,-816). Unfortunately, however, the solvencies of these binary azeotropic compositions for the common rosin fluxes which are employed in the manufacture of printed circuits, are not as high as might be desired and the solvents either leave deposits on the boards or become cloudy after use.

Summary of the invention

It is accordingly the major object of this invention to provide constant boiling or essentially constant boiling compositions which, while meeting the requirements of non-flammability and inertness to electronic components; possess particularly high solvency towards the rosin fluxes which are commonly used in the manufacture of printed electrical circuits and which therefore permit repeated cleaning treatments of such electrical circuits without significant redeposition of the flux upon the surface of the printed circuits upon removal of the solvent by evaporation.

Another object of the invention is to provide novel, constant boiling or essentially constant boiling compositions of matter which do not substantially change composition upon evaporation.

Other objects and advantages of the invention will be apparent from the forthcoming description.

In accordance with the invention it has been discovered that a ternary azeotropic mixture is formed at approximately 33.1 mole percent of 1,1,2-trichlorotrifluoroethane, 55.3 mole percent of methylene chloride and 11.6 mole percent of methyl alcohol and that the azeotrope boils at a temperature of about 34.1° C. at 760 mm.

It has also been found that this azeotropic mixture is non-flammable and inert to electronic components on printed circuit boards and that it exhibits unusually high solvency towards rosin fluxes which are commonly employed in the manufacture of such boards. As a consequence, samples of the novel azeotropic composition may be employed repeatedly and effectively as solvents to remove such rosin fluxes and upon evaporation leave no perceptible residues. Moreover, the solvent solutions remain clear even after repeated use. Since the azeotrope boils at a constant temperature, evaporation or distillation of the azeotrope in whole or in part does not change the composition of the liquid mixture. This is significant since it enables the azeotropic mixture to be handled and purified without the adverse effect of having its composition change as would occur with a non-azeotropic mixture.

It has been further found that there is a range of mixtures of 1,1,2-trichlorotrifluoroethane, methylene chloride and methyl alcohol likewise useful as solvents for printed circuit boards, which boil approximately within .5° C./760 mm. of the azeotropic mixture and which mixtures behave essentially as the azeotropic mixture, i.e. such mixtures are essentially constant boiling and do not change significantly in composition upon partial or complete evaporation or distillation.

The range of equivalent compositions, boiling within about .5° C./760 mm. of the azeotrope, is defined by Curve C as shown on the appended drawing. The compositions of all the ternary mixtures embraced within the area defined by Curve C can readily be read from the phase diagram. The value for any component of any mixture on the diagram may be read in mole percent along the axis indicated on the diagram. Thus as can be seen from the diagram, the azeotropic mixture, designated by the point marked X, has the composition

| | Mole, percent |
|---|---|
| $CCl_2FCClF_2$ | 33.1 |
| $CH_2Cl_2$ | 55.3 |
| $CH_3OH$ | 11.6 |

The diagram shows three curves representing isotherms (lines of constant temperature) representing boiling points of the mixtures at 760 mm. Hg.

Boiling points were determined in a vacuum jacketed ebulliometer of the "Cotrell" type with temperatures measured by a platinum resistance thermometer. The mixtures measured were made up in solution by weight. Eight binary solutions were prepared initially. By adding varying amounts of a third component, a number of different ternary solutions were made from each binary solution. A total of fifty-five ternary solutions were prepared and analyzed to collect the data for the phase diagram. The data were plotted on the diagram for each solution, with temperatures as a function of composition. The composition was noted of each solution that boiled at a temperature representing boiling point deviations of 0.50° C., 0.30° C. and 0.15° C. from the azeotropic boiling point. Smooth closed curves were then drawn through the points to yield the isotherms A, B and C shown on the diagram. Curve C is the isotherm which represents a boiling point within about 0.50° C./760 mm. from the azeotropic boiling point. Curve B is the isotherm which represents a boiling point within about 0.30° C./760 mm. from the azeotropic boiling point. Curve A is the isotherm which represents a boiling point within about 0.15° C./760 mm. from the azeotropic boiling point. The areas embraced by Curves A and B represent useful preferred sub-ranges of ternary mixtures within the scope of the invention.

The components of the novel ternary mixtures of the invention are all commercially available. Each should be employed in sufficiently high purity so as to avoid the introduction of adverse influences upon the constant boiling or essentially constant boiling characteristics of the system. A suitable grade of 1,1,2-trichlorotrifluoroethane, for example, is sold by Allied Chemical Corporation under the trade name "Genesolv-D."

The constant boiling or essentially constant boiling ternary mixtures of the invention may be purified and reclaimed for use after they have ultimately become saturated by simple flash distillation.

Description of the preferred embodiment

The following illustrate preparation of the azeotropic composition of the invention, which is the preferred embodiment, and the solvency properties exhibited by the same.

EXAMPLE 1

A sample of about equimolar amounts of 1,1,2-trichlorotrifluoroethane ($CCl_2FCClF_2$), B.P. 47.6° C., methylene chloride ($CH_2Cl_2$), B.P. 40.1° C. and methyl alcohol ($CH_3OH$), B.P. 64.5° C. was refluxed in a 4′ (length) x ½″ (diameter) laboratory still. The temperature at the still head was 33.7° C. at 753.6 mm. This corresponds to a temperature of 34.1° C. at 760 mm. It was noted that the latter temperature is below the boiling points of any of the $CCl_2FCClF_2$, $CH_2Cl_2$ or $CH_3OH$ components and also below the boiling points of the binary azeotropes which are known to form between these components, indicating that a ternary azeotrope is formed which is distinct from any previously known composition containing these materials. Approximately 1,000 g. of the azeotrope were collected boiling at 33.7° C. at the still head pressure of 753.6 mm. A sample of the azeotrope was analyzed by liquid-gas chromatography and the presence of $CCl_2FCClF_2$, $CH_2Cl_2$ and $CH_3OH$ was confirmed. The azeotrope was then redistilled, but no change in boiling point or composition was detected.

The exact composition was then determined by calibration of the chromatograms and was found to be:

| | Mole percent | Wt. percent |
|---|---|---|
| $CCl^2FCClF^2$ | 33.1 | 55.0 |
| $CH^2Cl^2$ | 55.3 | 41.7 |
| $CH^3OH$ | 11.6 | 3.3 |

This azeotrope was tested for flammability by the open cup flash point test (ASTM D1310–59T) and was classified as nonflammable.

EXAMPLE 2

The solvency power of the novel ternary azeotrope and the solvency powers of other related solvents were evaluated by determining their Kauri-Butanol values (K-B value) in accordance with ASTM test D1133–61. The only exception which was made was to use 3 grams of Standard Kauri-Gum Solution instead of 20 grams. Consequently, all results were multiplied by 6.66 to arrive at standardized test results. The results of these evaluations are noted in the following table.

TABLE 1

| Solvent: | K-B value |
|---|---|
| $CCl_2FCClF_2$ | 31 |
| Binary azetrope of $CCl_2FCClF_2$ and $CH_3OH$ | 49 |
| Binary azetrope of $CCl_2FCClF_2$ and $CH_2Cl_2$ | 86 |
| $CH_2Cl_2$ | 136 |
| Ternary azeotrope of $CCl_2FCClF_2$, $CH_2Cl_2$ and $CH_3OH$ | 148 |

The K-B values reported in the above table demonstrate the unusual and unexpectedly high solvency power of the ternary azeotrope of the invention. To illustrate, the binary azeotrope of $CCl_2FCClF_2$ and $CH_2Cl_2$ had a K-B value which was intermediate between the values of its components:

| | |
|---|---|
| $CCl_2FCClF_2$ | 31 |
| $CCl_2FCClF_2/CH_2Cl_2$ azeotrope | 86 |
| $CH_2Cl_2$ | 136 |

In the case of the binary azeotrope of $CCl_2FCClF_2$ and $CH_3OH$, which contains more methanol (6.4 wt. percent) than does our ternary azeotrope (3.3 wt. percent methanol); the increase in solvency over $CCl_2FCClF_2$ is not unexpected:

| | |
|---|---|
| $CCl_2FCClF_2$ | 31 |
| $CCl_2FCClF_2/CH_3OH$ azeotrope | 49 |

It will be noted that in the case of the ternary azeotrope, $CCl_2FCClF_2/CH_2Cl_2/CH_3OH$, which as noted above, contains less $CH_3OH$ than the $CCl_2FCClF_2/CH_3OH$ or less $CH_2Cl_2$ (41.7 wt. percent) than the $CCl_2FCClF_2/CH_2Cl_2$ azeotrope (48 wt. percent $CH_2Cl_2$); the K-B value is 148 which is higher even than pure $CH_2Cl_2$. Thus it can be seen that the presence of even very small amounts of $CH_3OH$ in the ternary azeotrope has an unexpectedly large beneficial effect upon the solvency power of the mixture.

The unexpectedly high solvency power of the novel ternary azeotrope manifests itself, when used as a cleaning fluid for printed electrical circuits, by the high retention of dissolved rosin fluxes in solution, even after repeated usage, thus tending to avert clouding of the solvent solution, precipitation of the rosin out of solution and redeposition of thin films of rosin back onto surfaces from which the fluxes have been removed.

EXAMPLE 3

A number of stainless steel test strips were coated with three common varieties of rosin fluxes; were baked in an oven at 400° F. for a period of 5 minutes; were allowed to cool; were immersed in several test solvents for a period of 60 seconds and then were removed. The results are noted in the following table.

TABLE II

| Solvent | Rosin Solder Flux | | |
|---|---|---|---|
| | "Dutchboy No. 120" [1] | "Kester No. 1544" [2] | "Alpha No. 610-35" [3] |
| Ternary Azeotrope | Trace of flux visible; no visible residue deposited. | Trace of flux visible; no visible residue deposited. | Trace of flux visible; no visible res due deposited. |
| Binary Azeotrope of $CCl_2FCClF_2$ and $CH_2Cl_2$. | Trace of flux visible; visible residue deposited. | Trace of flux visible; visible residue deposited. | Trace of flux visible; visible residue deposited. |
| Binary Azeotrope of $CCl_2FCClF_2$ and $CH_3OH$. | Incomplete removal of flux | Incomplete removal of flux | Incomplete removal of flux. |

[1] "Dutchboy No. 120" is a trademark of National Lead Company.
[2] "Kester No. 1544" is a trademark of Kester Solder Company.
[3] "Alpha No. 610-35" is a trademark of Alpha Metals, Inc.

All these rosins are commonly used in the manufacture of printed circuits and are said to contain as major ingredient some form of pine tree gum, containing abietic acid and related substances.

A number of 2" square sections of glass lined melamine circuit boards were coated with the same varieties of rosin fluxes and in the same manner in which the stainless steel test strips were coated, as described above, and then were dipped in different batches of the same solvent solutions as were used in the first test. The use of the $CCl_2FCClF_2/CH_3OH$ binary azeotrope resulted in incomplete removal of the fluxes as before. The $CCl_2FCClF_2/CH_2Cl_2$ binary azeotrope solvent solution became cloudy after only 5 test boards were cleaned. Further, the dissolved rosin fluxes agglomerated in the $CCl_2FCClF_2/CH_2Cl_2$ binary azeotrope solution upon standing, a result of the lower flux solubility in this solvent. By way of contrast, the $CCl_2FCClF_2/CH_2Cl_2/CH_3OH$ ternary azeotrope solution remained clear even after 20 test boards had been run through and did not agglomerate upon standing.

None of the solvents had any adverse effects upon the circuit board itself or the electrical components thereon.

The $CCl_2FCClF_2/CH_2Cl_2/CH_3OH$ ternary azeotrope of the invention finds other solvent applications, such as for removing greases and oils from a variety of industrial items and also may be used as a heat exchange medium and as a hydraulic fluid.

It will be apparent to those skilled in this art that, for specialized purposes, various additives could be incorporated with the novel ternary azeotrope, e.g., lubricants, detergents, etc. The invention is not intended to be limited by any specific embodiments disclosed herein, but by the scope of the appended claims.

We claim:

1. Ternary mixtures consisting essentially of 1,1,2-trichlorotrifluoroethane, methylene chloride and methyl alcohol in mole proportions defined by the area within Curve C as shown on the appended drawing.

2. Ternary mixtures according to claim 1 in which the mole proportions of the 1,1,2-trichlorotrifluoroethane, methylene chloride and methyl alcohol components are defined by the area within Curve B as shown on the appended drawing.

3. Ternary mixtures according to claim 1 in which the mole proportions of the 1,1,2-trichlorotrifluoroethane, methylene chloride and methyl alcohol components are defined by the area within Curve A as shown on the appended drawing.

4. A ternary mixture according to claim 1 which consists essentially of about 33.1 mole percent of 1,1,2-trichlorotrifluoroethane, about 55.3 mole percent methylene chloride and about 11.6 mole percent methyl alcohol and boils at about 34.1° C. at 760 mm. pressure.

References Cited

UNITED STATES PATENTS

| | | | |
|---|---|---|---|
| 2,999,816 | 9/1961 | Bennett et al. | 252—364 |
| 2,999,817 | 9/1961 | Bower | 252—364 X |

LEON D. ROSDOL, *Primary Examiner.*

S. D. SCHWARTZ, *Assistant Examiner.*